United States Patent
Winger et al.

(10) Patent No.: US 6,560,617 B1
(45) Date of Patent: May 6, 2003

(54) OPERATION OF A STANDBY SERVER TO PRESERVE DATA STORED BY A NETWORK SERVER

(75) Inventors: John M. Winger, Alpine, UT (US); David Green, Pleasant Grove, UT (US); Richard S. Ohran, Provo, UT (US); Michael R. Ohran, Orem, UT (US)

(73) Assignee: Legato Systems, Inc., Mountain View, CA (US)

( * ) Notice: Subject to any disclaimer, the term of this patent is extended or adjusted under 35 U.S.C. 154(b) by 0 days.

(21) Appl. No.: 09/271,585

(22) Filed: Mar. 18, 1999

Related U.S. Application Data

(63) Continuation of application No. 08/848,139, filed on Apr. 28, 1997, now Pat. No. 5,978,565, which is a continuation of application No. 08/441,157, filed on May 15, 1995, now abandoned, which is a continuation-in-part of application No. 08/094,755, filed on Jul. 20, 1993, now abandoned.

(51) Int. Cl.[7] .............................. G06F 17/30; H02H 3/05
(52) U.S. Cl. .......................... 707/204; 707/10; 707/100; 707/200; 714/4; 714/6; 714/15
(58) Field of Search .............................. 707/1, 10, 100, 707/104.1, 200, 206, 204; 714/15, 4, 6

(56) References Cited

U.S. PATENT DOCUMENTS

| | | | |
|---|---|---|---|
| 4,792,896 A | * 12/1988 | Maclean et al. ............... 703/25 |
| 5,157,663 A | 10/1992 | Major et al. .................. 371/9.1 |
| 5,307,481 A | 4/1994 | Shimazaki et al. .......... 395/575 |
| 5,408,649 A | 4/1995 | Beshears et al. ............ 395/575 |
| 5,438,674 A | * 8/1995 | Keele et al. .................... 711/4 |
| 5,455,932 A | 10/1995 | Major et al. ................. 395/489 |
| 5,488,716 A | 1/1996 | Schneider et al. ..... 395/182.08 |
| 5,533,191 A | 7/1996 | Nakano ................. 395/182.09 |
| 5,555,371 A | * 9/1996 | Duyanovich et al. ......... 714/13 |
| 5,600,784 A | * 2/1997 | Bissett et al. ............... 709/400 |
| 5,611,049 A | * 3/1997 | Pitts .............................. 707/8 |
| 5,633,999 A | 5/1997 | Clowes et al. ......... 395/182.04 |
| 5,666,479 A | 9/1997 | Kashimoto et al. ......... 395/180 |
| 5,987,627 A | * 11/1999 | Rawlings, III ............... 714/48 |

OTHER PUBLICATIONS

Steinberg, Jeffrey A., "Diverting Data From Disaster," Digital Review, vol. 8, No. 35, Nov. 18, 1991.

* cited by examiner

*Primary Examiner*—Vincent Millin
*Assistant Examiner*—Ella Colbert
(74) *Attorney, Agent, or Firm*—Workman, Nydegger & Seeley

(57) ABSTRACT

A method for providing rapid recovery from a network file server failure through the use of a backup computer system. The backup computer system runs a special mass storage access program that communicates with a mass storage emulator program on the network file server, making the disks or other mass storage devices on the backup computer system appear like they were disks on the file server computer. By mirroring data by writing to both the mass storage of the file server and through the mass storage emulator and mass storage access program to the disks on the backup computer, a copy of the data on the file server computer is made. Optionally, selected portions of the data read through the mass storage emulator program can be altered before being returned as the result of the read operation on the file server. In the event of failure of the file server computer, the backup computer can replace the file server, using the copy of the file server's data stored on its disks. A single backup computer can support a plurality of file server computers. Unlike other redundant file server configurations, this method does not require the backup computer system to be running the file server operating system.

42 Claims, 4 Drawing Sheets

OPERATION OF A STANDBY SERVER TO PRESERVE DATA STORED BY A NETWORK SERVER

RELATED APPLICATIONS

This is a continuation of U.S. patent application Ser. No. 08/848,139, entitled "Method for Rapid Recovery from a Network File Server Failure Including Method for Operating Co-Standby Servers," filed Apr. 28, 1997 now U.S. Pat. No. 5,978,565. U.S. patent application Ser. No. 08/848,139 is a continuation of application Ser. No. 08/441,157, entitled "Method for Rapid Recovery from a Network File Server Failure Including Method for Operating Co-Standby Servers," filed May 15, 1995, now abandoned, which is a continuation-in-part of application Ser. No. 08/094,755, entitled "Method for Rapid Recovery from a Network File Server Failure," filed Jul. 20, 1993, now abandoned. The foregoing patent applications and issued patents are incorporated herein by reference.

BACKGROUND OF THE INVENTION

1. Field of the Invention

This invention relates to network file server computer systems, and in particular to the methods used to recover from a computer failure in a system with a plurality of computer systems, each with its own mass storage devices.

2. Prior State of the Art

It is often desirable to provide continuous operation of computer systems, particularly file servers which support a number of user workstations or personal computers. To achieve this continuous operation, it is necessary for the computer system to be tolerant of software and hardware problems or faults. This is generally done by having redundant computers and mass storage devices, such that a backup computer or disk drive is immediately available to take over in the event of a fault.

A number of techniques for implementing a fault-tolerant computer system are described in Major et al., U.S. Pat. No. 5,157,663, and its cited references. In particular, the invention of Major provides a redundant network file server capable of recovering from the failure of either the computer or the mass storage device of one of the file servers. The file server operating system is run on each computer system in the network file server, with each computer system cooperating to produce the redundant network file server. This technique has been used by Novell to implement its SFT-III fault-tolerant file server product.

There are a number of reasons why the use of a redundant network file server such as described in Major may be undesirable. As can be seen from the description in Major, the software needed to provide such a redundant network file server is considerably more complex than the software of the present invention. This can result in a lower reliability due the increased presence of programming errors ("bugs") in the complex software. Also, the processing time required to handle a client request may be increased by the complexity of the redundant network file server software, when compared to a single-processor network file server. Finally, license restrictions or other limitations may make it infeasible or uneconomical to run a redundant network file server instead of a normal network file server.

SUMMARY OF THE INVENTION

It is an object of this invention to provide the rapid recovery from a network file server failure without the complex software of a redundant network file server. This is achieved by having a second, backup computer system with its own mass storage device (generally a magnetic disk). This backup computer is connected by an appropriate means for communications to the file server computer, allowing the transmission of information (such as commands and data) between the two computers. A mass storage emulator, running like a device driver on the file server computer, sends information to a mass storage access program on the backup computer. The mass storage access program performs the requested operation (read, write, etc.) on the mass storage system connected to the backup computer, and returns the result to the mass storage emulator on the file server computer.

This makes the mass storage device on the backup computer look like another mass storage device on the file server computer. The data mirroring option of the file server operating system can be activated (or, if the operating system does not support data mirroring, a special device driver that provides data mirroring can be used), so that a copy of all data written to the mass storage device directly connected to the file server will also be written to the mass storage device on the backup computer, through the mass storage emulator and mass storage access programs.

When a failure is detected in the file server computer system, the backup computer become the file server. The mass storage device of the backup computer will contain a copy of the information on the mass storage device of the failed file server, so the new file server can start with approximately the same data as when the previous file server failed.

It is a further object of this invention to allow a single backup computer to support a plurality of file server computers. This is achieved by having each file server computer run a mass storage emulator. The backup computer can run either a single mass storage access program capable of communicating with a plurality of mass storage emulators. Alternatively, if the operating system on the backup computer permits the running of multiple processes, the backup computer can run a separate mass storage access program for each mass storage emulator.

It is a further object of this invention to improve the reliability of a redundant network file server computer system by reducing the complexity of the software when compared to the software of a redundant network file server. The programs for the mass storage emulator on the file server computer and the mass storage access on the backup computer can be considerably less complex than a full redundant file server operating system.

Furthermore, while it is possible for the backup computer to be running the file server operating system (and acting as another file server), it is also possible to run the mass storage access program under a simple operating system or as a stand-alone program, reducing the complexity and increasing the performance of the backup computer system.

These and other features of the invention will be more readily understood upon consideration of the attached drawings and of the following detailed description of those drawings and the presently preferred embodiments of the invention.

DETAILED DESCRIPTION OF THE PREFERRED EMBODIMENTS

Figure 1:
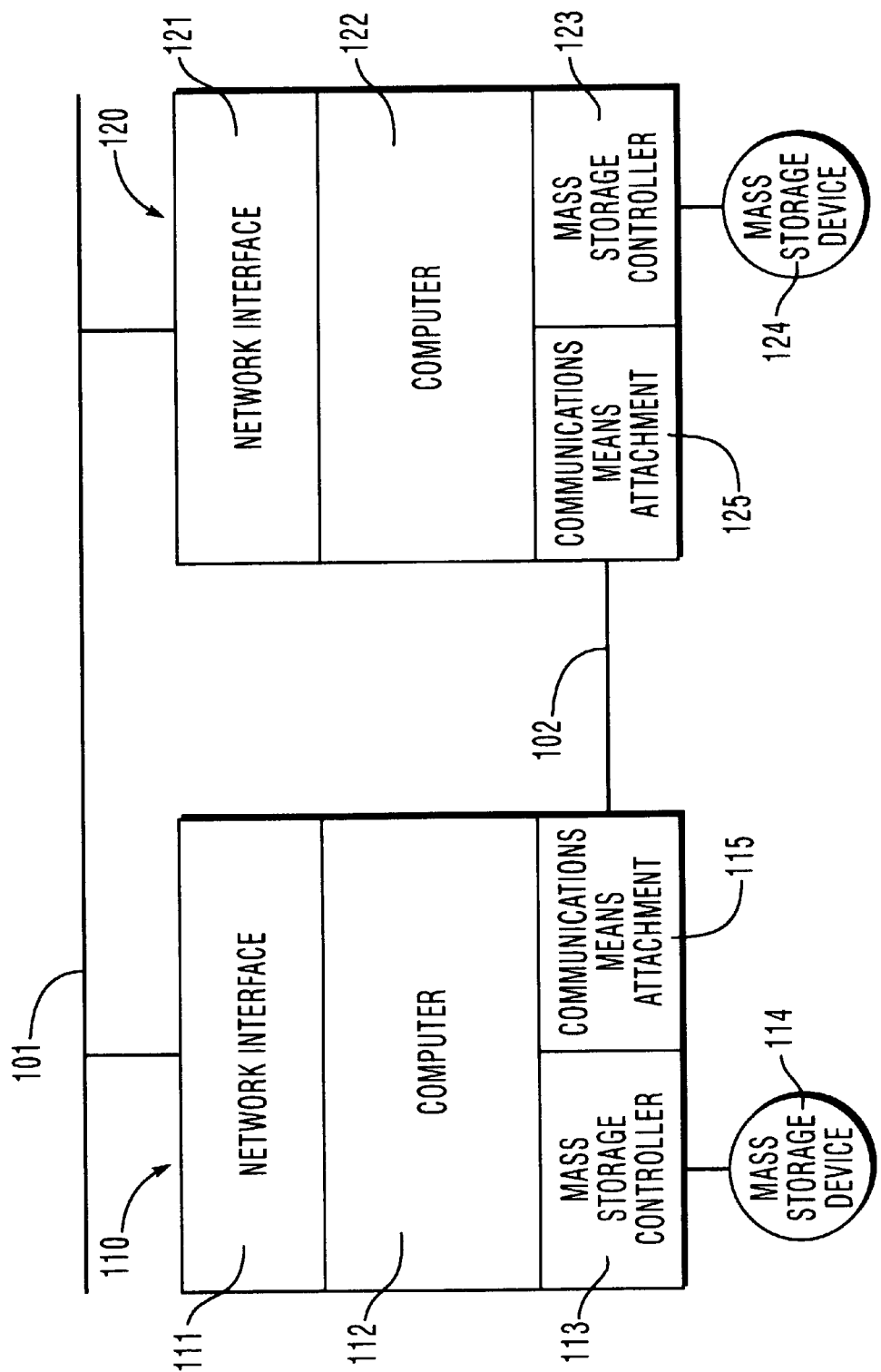
FIG. 1 illustrates a computer configuration on which the method of the invention runs.

Referring to FIG. 1, which illustrates a representative computer configuration on which the method of the invention runs, it can be seen that there are two computer systems 110 and 120. The first computer system 110 is running a file server operating system (such as Novell NetWare®). Computer system 110 includes computer 112 connected to network 101 through interface 111 (and its associated software), and mass storage device 114 connected through controller 113 (and its associated software). These represent the standard components of a network file server. In the case of NetWare, computer 112 may be a PC-compatible computer based on an Intel 486 or Pentium processor, network 101 can be an ethernet (so that interface 111 is an ethernet interface), and mass storage device 114 can be a SCSI or IDE magnetic disk connected through an appropriate controller 113. Computer 122 would also be a PC-compatible computer, so that it could also run the same NetWare file server operating system as computer 112. Network 101 could also be implemented as a token ring, Arcnet, or any other network technology.

The mass storage devices of the invention should not be viewed as limited to magnetic disk drives, but can also be implemented using optical discs, magnetic tape drives, or any other medium capable of handling the read and write requests of the particular computer system.

Added to the standard network file server to support the method of this invention are a backup computer system 120 and a means 102 for communicating between computer system 110 and computer system 120.

Computer system 120 has components similar to computer system 110. Computer system 120 can be connected to network 101 through interface 121, although it is not necessary for computer system 120 to actually be connected to network 101 during normal operation. Computer 122 is connected to interface 121 and to mass storage device 124 through controller 123.

While it is not necessary for computer system 120 to have identical components to computer system 110, in many cases that will be the case. In other cases, computer system 120 may be an older, slower system previously used as a file server but replaced with computer system 110. All that is required of computer system 120 is that it be capable of running the file server operating system in case of the failure of computer system 110, and that its mass storage device 124 be of sufficient capacity to hold the data mirrored from mass storage device 114.

Communications means 102 provides a link between computer systems 110 and 120. Computer 112 is connected to communications means 102 through attachment 115, and computer 122 is connected to communications means 102 through attachment 125. Communications means 102 can be implemented using a variety of techniques, well-known to those skilled in the art. In the preferred embodiments, a high-speed serial point-to-point link is used. An alternative would be to use the serial communications ports of computers 112 and 122, programmed to run at a high data rate, or the parallel interfaces of computers 112 and 122. Another alternative is for communications means 102 to be a virtual circuit or channel carried on network 101. In this latter case, communications means 102 would really be network 101, attachment 115 would really be interface 111, and attachment 125 would really be interface 121.

It is important that communication means 102 provide data transfer at rates comparable to the data rate of mass storage device 124 so that it does not limit the performance of the system. The method of this invention is not dependent on the particular implementation of communications means 102, although a communications means 102 dedicated only to the method of this invention will generally result in more efficient operation and simpler programs.

Figure 2:
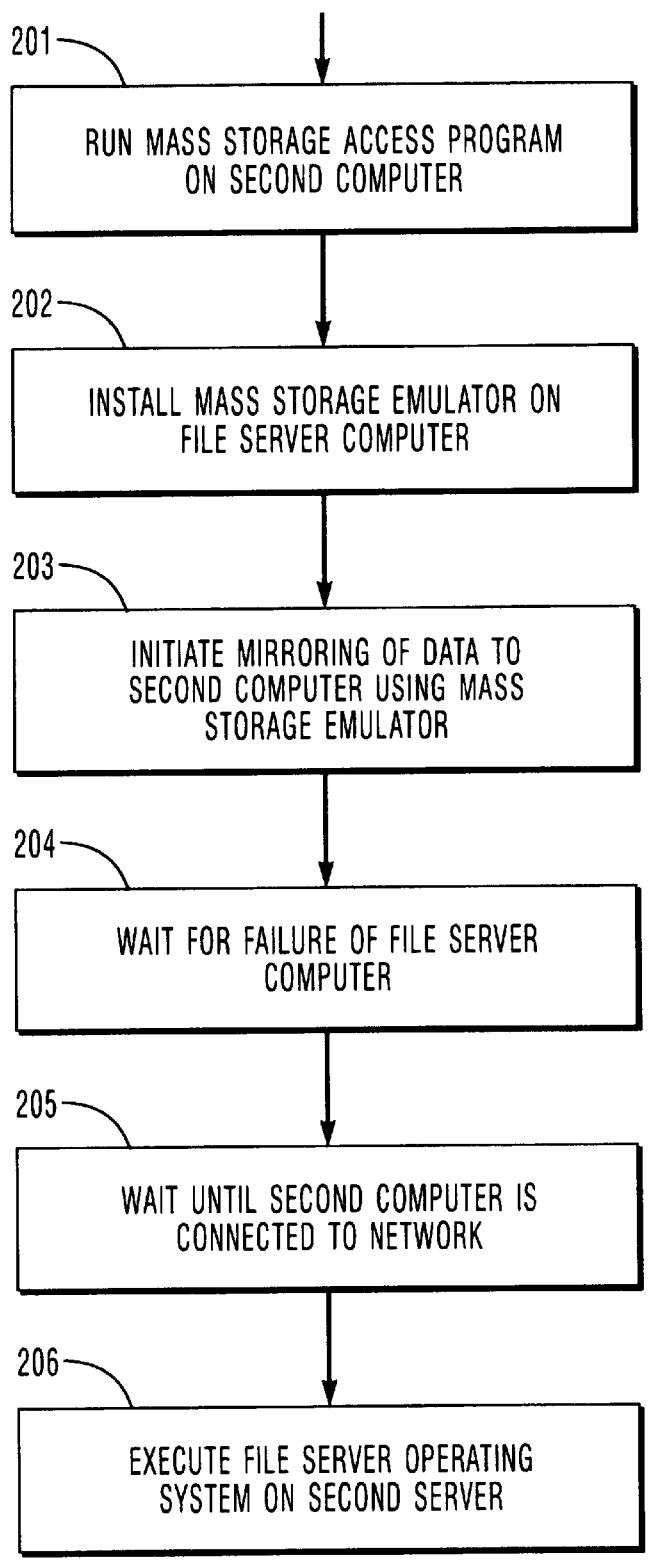
FIG. 2 is a flow diagram showing the steps of one preferred embodiment of the method of the invention.

FIG. 2 is a flow diagram showing the steps of the method of the invention. In step 201, a special program, the mass storage access program, is run on computer system 120. The mass storage access program receives commands from computer system 110 over communications means 102. Based on those commands, the mass storage access program accesses mass storage device 124 to perform the operation specified in the command received from computer system 110. The results of the accessing of mass storage device 124 is returned to computer system 110 over communications means 102.

The mass storage access program can be enhanced to provide a cache of data on mass storage device 124. The implementation of such a cache function is well-known in the art, consisting of keeping a copy of the most recently accessed information of mass storage device 124 in the memory of computer 122. When a read command is received, it is not necessary to access mass storage device 124 if a copy of the data is in the cache. Since computer 122 has a large memory (it must be large enough to run the file server operating system) and the mass storage access program is quite small, there is a large amount of memory available for the cache, particularly if computer 122 is only running the mass storage access program. This means that many entries will be in the cache, and the chance of finding a block being read in the cache is higher than would be normal for a similar cache in a file server operating system.

In step 202, coincidentally with the running of the mass storage access program on computer system 120, another program, the mass storage emulator, is installed on computer system 110. The mass storage emulator takes mass storage requests from the file server operating system running on computer system 110 and sends them as commands over communications means 102 to computer system 120, where they are processed by the mass storage access program, as discussed above.

When results from a command are received from the mass storage access program over communications means 102 by the mass storage emulator, they are returned to the file server operating system, much as the result of a normal mass storage request would be returned. In this way, the mass storage access program and the mass storage emulator cooperate to make it appear to the file server operating system that mass storage device 124 is directly connected to computer 112 on computer system 110.

In most cases, the results returned from a read operation will be the data stored at the specified mass storage location. However, in some embodiments of the invention it will be desirable to return an alternative value for special mass storage locations. For example, the first block on many mass storage systems contains information such as volume names. It may be necessary to avoid duplicate volume names, so alternative data for the first block, containing a non-duplicate volume name, will be returned by the mass storage access program for a read of the first block.

The alternative data could be stored as part of the mass storage access program, stored in a special location on the mass storage device accessed by the mass storage access program, or stored on another mass storage device. It can also be generated by the mass storage access program from the data stored in the special location, such as modifying a particular field. In any case, when one of the special locations is read, the mass storage access program transfers the alternative data to the mass storage emulator.

In one embodiment of this invention, the mass storage access program is a conventional program running under the disk operating system of personal computer 122. The disk storage emulator is a NetWare Loadable Module (NLM), much like the device driver for a disk drive. Copies of the source code for the mass storage access program and the mass storage emulator are given in the microfiche appendix.

In another embodiment of this invention, both computer systems 110 and 120 are running copies of the file server operating system. Computer system 120 can function as a file server while acting as a backup for computer system 110. The mass storage access program running on computer system 120 can be either a regular user program or a NetWare Loadable Module.

Figure 3:
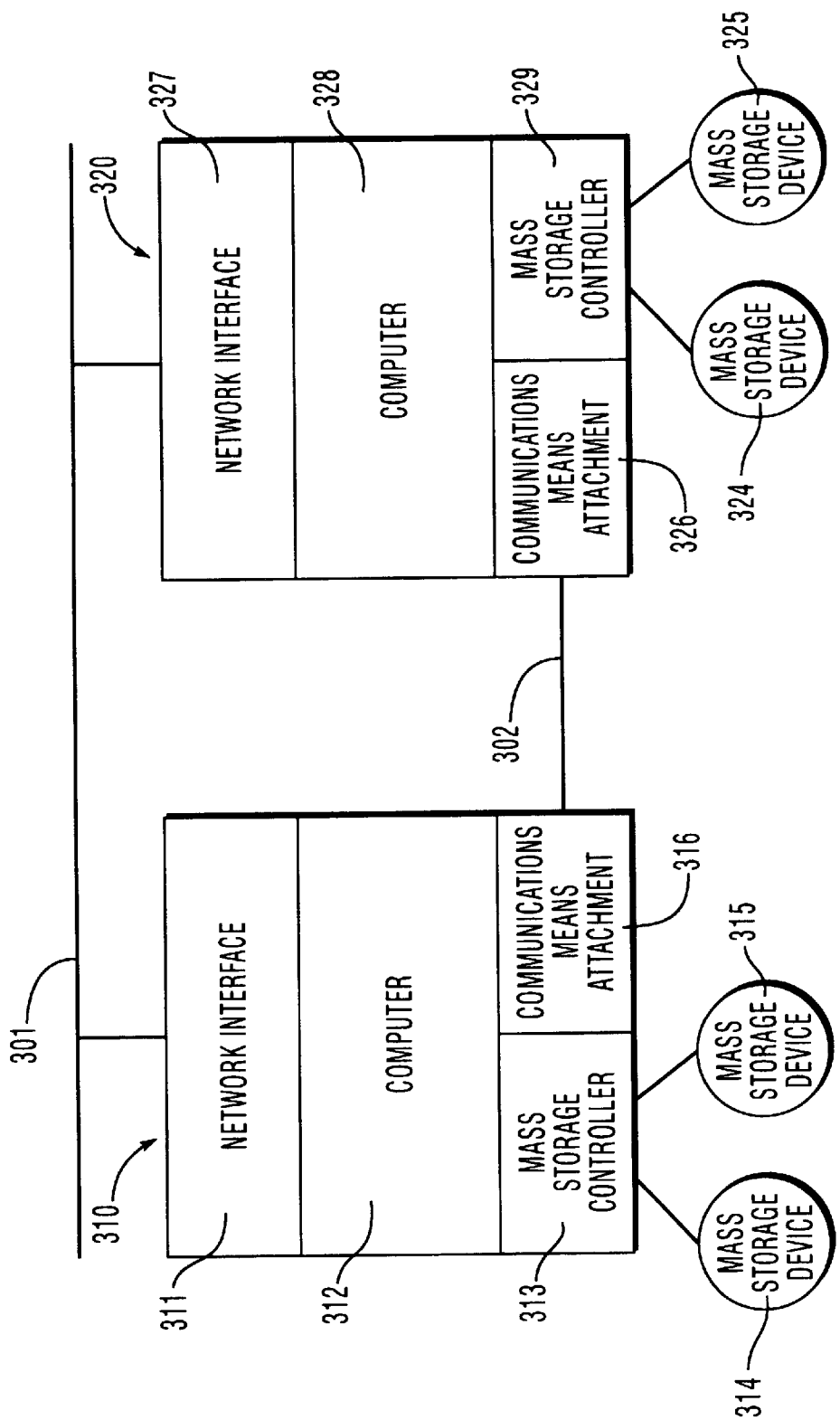
FIG. 3 illustrates a computer configuration with two file server computers.

In yet another embodiment of this invention, illustrated in FIG. 3, both computer systems 310 and 320 are running copies of the file server operating system, and each is acting as a backup for the other. Computer system 310 is running a mass storage emulator allowing it to access mass storage device 324 on computer system 320 by communicating with the mass storage access program running on computer system 320. Likewise, computer system 320 including computer 328 and network interface 327 is running a mass storage emulator 329 allowing it to access mass storage device 314 on computer system 310 by communicating with the mass storage access program running on computer system 310. Each file server is acting as a backup for the other using the present invention. Thus, if either file server goes down, the other can continue to serve the needs of the computer network without down time. And when neither file server is down, the users enjoy the benefits of fully utilizing the resources of their redundant file server capability. This is advantageous in comparison to utilizing a single dedicated backup file server which provides no services for users until the primary file server becomes unavailable.

If both computer systems 310 and 320 are running the file server operating system, there may be difficulties if the file server operating system uses special names in the labels of the disks. As illustrated in FIG. 3, file server 310 has mass storage devices 314 and 315, and file server 320 has mass storage devices 324 and 325. Mass storage devices 314 and 324 are the normal system disks on computer systems 310 and 320, respectively, and mass storage devices 315 and 325 are used to backup the other file server.

Often, an operating system such as NetWare will use a special disk label such as SYS for its main system disk. In the system of FIG. 3, mass storage devices 314 and 324, the normal system disks, will have the label SYS. However, because mass storage device 325 is a mirror of mass storage device 314, mass storage device 325 would normally also have the label SYS. Similarly, mass storage device 315 the mirror of mass storage device 324, would also have the label SYS. With many operating systems, such duplicate labels would cause difficulties.

This problem can be overcome by altering the mass storage access programs running on computer systems 310 and 320 to return alternative data when a read operation is performed on certain mass storage locations. To handle the duplicate label problem, each mass storage access program is configured to return an alternative label whenever the mass storage location containing the label is read.

For example, mass storage device 315 might have a real label of SYS.LEE (indicating that it is a mirror copy of the SYS disk of file server LEE) but the mass storage access program on computer system 310 would be programmed to return a label of SYS to the mass storage emulator running on computer system 320 whenever the label location is read. This would mean that computer system 310 would see disks with different labels (SYS for mass storage device 314 and SYS.LEE for mass storage device 315). However, computer system 320 would see the label SYS on both mass storage device 324 and on mass storage device 315, the mirror for mass storage device 324. Similarly, the real label for mass storage device 325 might be SYS.DAN (mirror copy of disk SYS on server DAN) but a label of SYS would be seen by computer system 310.

Returning to FIG. 2, in step 203, mirroring of data is initiated. When data is being mirrored on two or more mass storage devices, whenever data is to be written it is written to all mass storage devices taking part in the mirroring, at the same location on each mass storage device. (The location may be relative to the start of the mass storage device, or to the start of a partition or contiguous portion of the mass storage device, as appropriate to the way the mass storage device has been formatted and is being used.) Data can be read from any mass storage device taking part in the mirroring, since each mass storage device contains identical data.

Mirroring may be an integral function of the file server operating system, so that no special program is necessary for implementing disk mirroring as part of the method of this invention. Step 203 only requires the activation or starting of mirroring on the part of the file server operating system. This is the case in the preferred embodiments of the invention, operating with NetWare and using the mirroring facilities of that file server operating system.

If the file server operating system does not provide mirroring, a separate mirroring module will have to be implemented. Such a mirroring module, whose implementation should be obvious to one skilled in the art, will take each write request and pass it to the driver for each mass storage device taking part in the mirroring. For mass storage device 124 on computer system 120, the driver will be the mass storage emulator, discussed above. When successful completion of the write request has been received from all mass storage devices taking part in the mirroring, the mirroring module will indicate successful completion to the file server operating system.

For read requests, the mirroring module can direct the read request to any of the mass storage devices, since all contain identical data. Generally, the read request will be directed to the mass storage device which is first available to handle the request.

As part of the initiating of mirroring, it is necessary to assure that each mass storage device taking part in mirroring has the same contents at the start of mirroring. This can be done by designating one of the mass storage devices as the master, and making a copy of the master mass storage device's data to all other mass storage devices taking part in the mirroring. An alternative approach is to have a timestamp indicating when the last change was made to the data on a mass storage device. If the timestamp on a mass storage device is the same as the timestamp on the master mass storage device, it will not be necessary to make a new copy of the data.

At step 204, the method of this invention waits until a failure of file server computer system 110 is detected. Such a failure could come from the failure of either hardware (such as computer 112 or mass storage device 114) or software (such as the file server operating system). Although means for automatically detecting such a failure may be used, such failure can also be detected by a system operator or workstation user noticing that file server requests are no longer being handled by computer system 110. It is not difficult for a user to determine there is a problem with file server computer system 110; in most cases, a user workstation will stop working and "hang' while it waits for a file server request that will never be honored.

In step 205, when a failure of computer system 110 has been detected, if computer system 120 is not currently connected to network 101 through interface 121, it is connected to network 121. This can be done either by activating interface 121 or physically connecting interface 121 to network 101, as appropriate.

In step 206, when computer system 120 has been connected to network 101, the file server operating system is loaded into computer 122 and executed if computer 122 is not already running the file server operating system, so that computer system 120 is a file server computer system. New file server computer system 120 now responds to requests received from network 101 as failed file server computer system 110 did before its failure. The file server operating system executing on computer 122 accesses mass storage device 124 to respond to the requests.

Note that because mass storage device 124 received data through the mass storage emulator and mass storage access program while file server computer system 110 was operating, mass storage device 124 contains a copy of the data stored on mass storage device 114 prior to the failure of computer system 120. (Because of timing, the last few write operations may not have occurred on all mass storage devices taking part in mirroring, but the file server operating system is capable of handling these small differences.) Because a copy of the mass storage data of failed file server computer system 110 is immediately available to new file server computer system 120, the time necessary to recover from a file server failure is minimal.

When the fault that caused the failure of computer system 120 has been corrected, fault-tolerant operation can be restored. Depending on the relative capabilities of computer systems 110 and 120, one of two techniques can be employed. Both involve the same method steps as were discussed above.

If the two computer systems have components of similar speed and capacity, there is no reason not to continue using computer system 120 as the file server computer. In this case, computer system 110 can now be treated as the backup computer system. The mass storage access program is run on computer system 110, the mass storage emulator is installed on computer system 120, and mirroring is initiated on the file server operating system running on computer system 120. As part of the initiating of mirroring, any data written to mass storage device 124 during the time computer system 110 was not available is now copied to mass storage device 114 though the mass storage emulator, communications mean 102, and the mass storage access program.

Alternatively, if computer system 120 is less capable than computer system 110, it will be desirable to make computer system 110 the file server computer system when the failure has been corrected. To accomplish this, two approaches are possible. In the first approach, computer system 110 is brought up as the backup computer system, running the mass storage access program, as discussed above. When mass storage device 114 contains a copy of the data on mass storage device 124, computer system 110 can be restarted as the file server (running the file server operating system) and computer system 120 can be restarted as the backup computer in accordance with the method discussed above.

The second approach is when the failure of computer system 110 has been corrected, computer system 120 is restarted as backup computer system, running the mass storage access program, and computer system 110 is restarted as the file server computer, running the file server operating system and the mass storage emulator. When mirroring is initiated, it will be determined by the timestamps stored on each of mass storage devices 114 and 124 that the data on mass storage device 114 is out of date. The file server operating system will read the data on mass storage device 124 (though the mass storage emulator, communications means 102, and the mass storage access program). It will also copy the data from mass storage device 124 to mass storage device 114 until they contain identical data.

Figure 4:
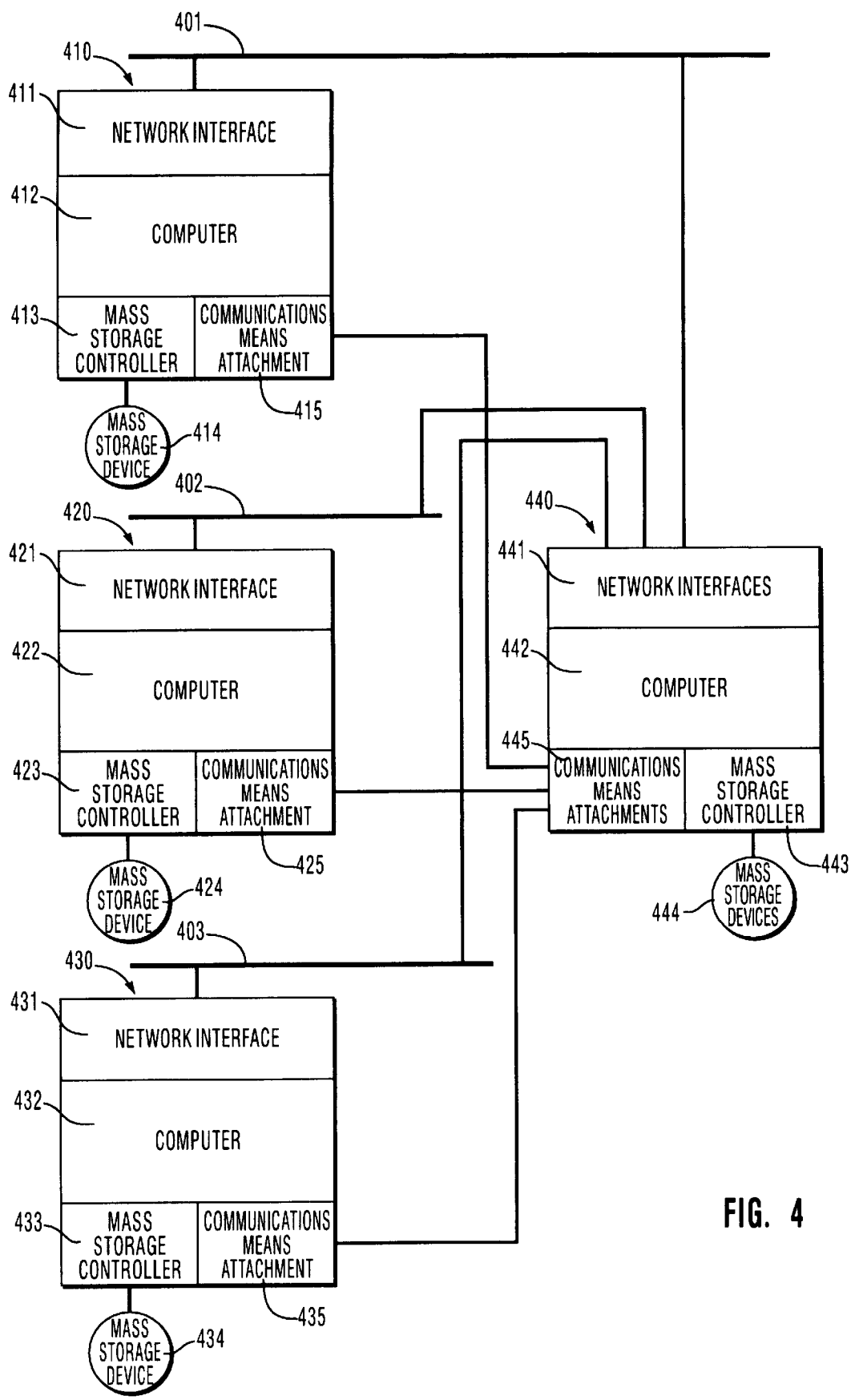
FIG. 4 illustrates a single backup computer supporting a plurality of file server computers.

It is possible for a single computer system to act as the backup for a plurality of file server computers, not just a single file server as was discussed above. FIG. 4 illustrates one possible configuration. It shows three file server computer systems 410, 420, and 430 serving networks 401, 402, and 403, respectively. They can communicate with backup computer system 440 through communications means attachments 415, 425, 435, and 445. Communications means attachments 445 can be a single device, or three identical devices interfaced to computer 442. Computer 442 can also be attached to networks 401, 402, or 403 through network interfaces 441. Network interfaces 441 could be a single device switchable to networks 401, 402, or 403, as required, a single device capable of connecting to three networks, or three separate devices.

Each file server computer 410, 420, and 430 runs a mass storage emulator as previously described. Backup computer 440 can run either a single mass storage access program capable of communicating with a plurality of mass storage emulators. Alternatively, if the operating system on the backup computer permits the running of multiple processes, the backup computer can run a separate mass storage access program for each mass storage emulator. Backup data is stored on mass storage devices 444, which must have a total capacity equal to the sum of the capacities of mass storage devices 414, 424, and 434 which are being mirrored. Mass storage device 444 can be implemented as a single, large storage device or a plurality of smaller storage devices.

When a failure of one of file server computers 410, 420, or 430 is detected, backup computer 440 takes on the role of the failed file server as described above. While acting as a file server, backup computer 440 can continue to act as a backup for the remaining file servers by continuing to run a mass storage access program.

Computer programs implementing the mass storage emulator and the mass storage access program will commonly be distributed to users on a computer-readable medium such as floppy disk or CD-ROM. From there, they will often be copied to a hard disk or a similar intermediate storage medium. When the mass storage emulators or mass storage access programs are to be run, they will be loaded either from their distribution medium or their intermediate storage medium into the execution memory of the computer, configuring the computer to act as a mass storage emulator or mass storage access program.

It is to be understood that the above described embodiments are merely illustrative of numerous and varied other embodiments which may constitute applications of the principles of the invention. Such other embodiments may be readily devised by those skilled in the art without departing from the spirit or scope of this invention and it is our intent they be deemed within the scope of our invention.

The attached appendix includes computer source code of one preferred embodiment of the invention.

What is claimed and desired to be secured by United States Letters Patent is:

1. A real time backup system comprising:
   at least one primary server for executing a data modification request, each primary server having a primary non-volatile storage medium where the data modification request is saved, wherein the at least one primary server runs a file server operating system;
   user means for communicating the data modification request to at least one primary server;
   at least one secondary server for executing the data modification request, each having a secondary non-volatile storage medium where the data modification request is saved;
   first communication means for communicating the data modification request from the user means to the at least one primary server; and
   second communication means for communicating the data modification request from the at least one primary server to the at least one secondary server, wherein the second communication means operates such that the secondary non-volatile storage medium appears to be directly connected with the at least one primary server and wherein the second communication means includes:
      a mass storage emulator at the at least one primary server;
      a communication link between the at least one primary server and the at least one secondary server; and
      a mass storage access program at the at least one secondary server.

2. A system as defined in claim 1, wherein the at least one secondary server operates a file operating system.

3. A system as defined in claim 1, wherein the data modification request is a file modification request.

4. A system as defined in claim 1, wherein the data modification request is independent of any file structure that may be associated with data stored at the at least one primary server.

5. A system as defined in claim 1, wherein the data modification request is saved at the primary non-volatile storage medium at any of the at least one primary server by modifying data stored at said primary non-volatile storage medium in accordance with the data modification request.

6. A system as defined in claim 5, wherein the data modification request is saved at the secondary non-volatile storage medium at any of the at least one secondary server by modifying data stored at said secondary non-volatile storage medium in accordance with the data modification request.

7. In a computing environment that includes a primary system associated with a primary non-volatile storage medium and a secondary system associated with a secondary non-volatile storage medium, wherein a file operating system is running on the primary system and wherein the secondary system is capable of running the file operating system, a method for backing up the primary non-volatile storage medium in real time, comprising the steps of:
   receiving a data modification request at the primary system;
   modifying the primary non-volatile storage medium in accordance with the data modification request;
   communicating the data modification request from the primary system to the secondary system using a mass storage emulator; and
   modifying the secondary non-volatile storage medium in accordance with the data modification request using a mass storage access program, wherein the mass storage access program and the mass storage emulator operate such that the secondary non-volatile storage medium appears to be directly connected to the primary system.

8. A method as defined in claim 7, further comprising the step of communicating the data modification request from a user of the primary system to the primary system.

9. A method as defined in claim 7, wherein the step of communicating the data modification request comprises the step of transmitting the data modification request from the mass storage emulator at the primary system, through a communication link between the primary system and the secondary system, to the mass storage access program at the secondary system.

10. A method as defined in claim 7, further comprising the step of notifying the primary system of a result of the step of modifying the second non-volatile storage medium.

11. A method as defined in claim 10, wherein the step of notifying the primary system comprises the step of transmitting a notification of the result from a mass storage access program at the secondary system, through a communication link between the primary system and the secondary system, to a mass storage emulator at the primary system.

12. In a computing environment that includes a first computer having a first mass storage device, the first computer being interconnected by a communication link to a second computer, the second computer having a second mass storage device, a method for maintaining at the second mass storage device a current copy of data stored on the first mass storage device comprising the steps of:
   executing, on the first computer, a mass storage emulation program such that the first computer has access to the second mass storage device;
   executing, on the second computer, a mass storage access program for accessing the second mass storage device, the mass storage access program being connected to the mass storage emulation program on the first computer by the communication link such that the second mass storage appears to be directly connected with the first computer, wherein the mass storage access program returns an alternative label for the second mass storage device to the primary computer when the second computer is running a file operating system;
   identifying data of the first mass storage device, wherein a current copy of the data is to be stored at the second mass storage device;
   synchronizing the second mass storage device with the data of the first mass storage device such that the second mass storage device contains an identical copy of the data stored at the first mass storage device;
   communicating changes made to the data of the first mass storage device through the mass storage emulation program, over the communications link, to the mass storage access program; and
   storing the communicated changes in the copy contained by the second mass storage device.

13. A method as recited in claim 12, further comprising the steps of:

transmitting, from the mass storage emulation program to the mass storage access program, a request to read selected data stored in the copy at the second mass storage device; and transmitting, from the mass storage access program to the mass storage emulation program, the selected data that has been read from the copy at the second mass storage device in response to the request.

14. A method as recited in claim 12 wherein an operating system function of the first computer communicates changes made to the data of the first mass storage device to the emulation program.

15. A method as recited in claim 12 further comprising the step of executing, on the first computer, a special driver that communicates changes made to the data of the first mass storage device to the emulation program.

16. A method as recited in claim 12 wherein the first computer and the second computer each run a same operating system.

17. A method as recited in claim 12 wherein the first computer and the second computer are peers on a network.

18. A method as recited in claim 12 wherein the communication link is a dedicated link between the first computer and the second computer.

19. A method as recited in claim 12 wherein the communication link is a network connection between the first computer and the second computer.

20. A method as defined in claim 12, wherein the mass storage emulation program permits the first computer to access the second mass storage device as if the second mass storage device were another mass storage device at the first computer.

21. A method as recited in claim 12 wherein the method also includes maintaining at the first mass storage device a current copy of data stored on the second mass storage device, comprising the steps of:

executing, on the first computer, another mass storage access program for accessing the first mass storage device, the other mass storage access program communicating over the communication link with another mass storage emulation program on the second computer, resulting in the first computer executing both the mass storage emulation program and the other mass storage access program;

executing, on the second computer, the other mass storage emulation program such that the second computer has access to the first mass storage device, resulting in the second computer executing both the other mass storage emulation program and the mass storage access program;

identifying data of the second mass storage device, wherein a current copy of the data of the second mass storage device is to be stored at the first mass storage device;

synchronizing the first mass storage device with the data of the second mass storage device such that the first mass storage device contains an identical copy of the data stored at the second mass storage device;

communicating changes made to the data of the second mass storage device through the other mass storage emulation program, over the communications link, to the other mass storage access program; and storing, to the copy contained by the first mass storage device, the communicated change of the data of the second mass storage device.

22. In a computing environment that includes at least one primary computer, each having a primary mass storage device, wherein each primary computer is interconnected through a communication link to a backup computer, the backup computer having a backup mass storage device, a method for maintaining at the backup mass storage device a current copy of data stored on each primary mass storage device comprising the steps of:

executing, on each primary computer, a mass storage emulation program such that each primary computer has access to the backup mass storage device such that the backup mass storage device appears to be directly connected to each primary computer;

executing, on the backup computer, a mass storage access program for accessing the backup mass storage device, the mass storage access program being connected to the mass storage emulation program on each primary computer by a communication link associated with the particular primary computer, wherein the backup computer provides an alternative label for the backup mass storage device to each primary server if the backup computer system is running a file operating system such that each primary computer sees a label that is the same as the mass storage device of the respective primary computer;

identifying data of each primary mass storage device, wherein a current copy of the data is to be stored at the backup mass storage device;

synchronizing the backup mass storage device with the data of each primary mass storage device such that the backup mass storage device contains an identical copy of the data stored at each primary mass storage device;

communicating changes made to the data of each primary mass storage device through the mass storage emulation program executing on the particular primary computer, over the associated communication link, to the mass storage access program; and storing the communicated changes to the copy of the data of the particular primary mass storage device contained by the backup mass storage device.

23. A method as recited in claim 22 wherein an operating system fuinction of each primary computer communicates changes made to the data of the particular primary mass storage device to the emulation program.

24. A method as recited in claim 22 fuirther comprising the step of executing, on each primary computer, a special driver that communicates changes made to the data of the primary mass storage device to the emulation program.

25. A method as recited in claim 22 wherein each communication link is a dedicated link between the associated primary computer and the backup computer.

26. A method as recited in claim 22 wherein each communication link is a network connection between the associated primary computer and the backup computer.

27. A method as recited in claim 22 wherein the backup computer also operates as another primary computer.

28. In a computing environment that includes a first computer having a first mass storage device, the first computer being interconnected by a communication link to a second computer having a second mass storage device, a system for maintaining at the second mass storage device a current copy of data stored on the first mass storage device comprising:

mass storage emulation program means, at the first computer, for accessing the second mass storage device from the first computer;

mass storage access program means, at the second computer, for accessing the second mass storage device, wherein the mass storage emulation means operates with the mass storage access program means to make the second mass storage device appear to be directly connected with the first computer;

means for identifying data of the first mass storage device, wherein a current copy of the data is to be stored at the second mass storage device;

means for synchronizing the second mass storage device with the data of the first mass storage device such that the second mass storage device contains an identical copy of the data stored at the first mass storage device;

means for communicating changes made to the data of the first mass storage device from the mass storage emulation program means at the first computer to the mass storage access program means at the second computer; and means for storing the communicated changes to the copy of the data of the first mass storage device contained by the second mass storage device.

29. A system as recited in claim 28 further comprising means for returning data from the second computer, in response to requests for data from special locations of the second mass storage device, the data having been altered from what is actually stored on the second mass storage device.

30. A system as recited in claim 28 wherein an operating system function of the first computer communicates changes made to the data of the first mass storage device to the emulation program means.

31. A system as recited in claim 28 further comprising, at the first computer, means for communicating changes made to the data of the first mass storage device to the emulation program means.

32. A system as recited in claim 28 wherein the first computer and the second computer each run a same operating system.

33. A system as recited in claim 28 wherein the first computer and the second computer are peers on a network.

34. A system as recited in claim 28 wherein the communication means is a dedicated link between the first computer and the second computer.

35. A system as recited in claim 28 wherein the means for communicating comprises a network connection between the first computer and the second computer.

36. A system as recited in claim 28 wherein the system further operates to maintain at the first mass storage device a current copy of data stored on the second mass storage device, the system further comprising:

another mass storage access program means, at the first computer, for accessing the first mass storage device, such that the first computer includes both the mass storage emulation program means and the other mass storage access program means;

another mass storage emulation program means, at the second computer, for accessing the first mass storage device from the second computer, such that the second computer includes both the other mass storage emulation program means and the mass storage access program means;

means for identifying data of the second mass storage device, wherein a current copy of the data of the second mass storage device is to be stored at the first mass storage device;

means for synchronizing the first mass storage device with the data of the second mass storage device such that the first mass storage device contains an identical copy of the data stored at the second mass storage device;

means for communicating changes made to the data of the second mass storage device through the other mass storage emulation program means, over the communications link, to the other mass storage access program means; and means for storing, to the copy contained by the first mass storage device, the communicated changes of the data of the second mass storage device.

37. In a computing environment that includes at least one primary computer, each having a primary mass storage device, wherein each primary computer is interconnected through a communication link to a backup computer, the backup computer having a backup mass storage device, a system for maintaining at the backup mass storage device a current copy of data stored on each primary mass storage device comprising:

mass storage emulation program means, at each primary computer, for accessing the backup mass storage device from the particular primary computer;

mass storage access program means, at the backup computer, for accessing the backup mass storage device, the mass storage access program means being connected to the mass storage emulation program means on each primary computer by a communication link associated with the particular primary computer, wherein the backup mass storage device appears to be directly connected to each primary computer, wherein the backup computer provides an alternative label for the backup mass storage device to each primary server if the backup computer is running a file operating system;

means for identifying data of each primary mass storage device, wherein a current copy of the data is to be stored at the backup mass storage device;

means for synchronizing the backup mass storage device with the data of each primary mass storage device such that the backup storage device contains an identical copy of the data stored at each primary mass storage device;

means for communicating changes made to the data of each primary mass storage device through the mass storage emulation program means executing on the particular primary computer, over the associated communication link, to the mass storage access program means executing on the backup program; and means for storing the communicated changes to the copy of the data of the particular primary mass storage device contained by the backup mass storage device.

38. A system as recited in claim 37 wherein an operating system function of each primary computer communicates changes made to the data of the particular primary mass storage device to the emulation program means.

39. A system as recited in claim 37 further comprising means for executing, on each primary computer, a special driver that communicates changes made to the data of the primary mass storage device to the emulation program means.

40. A system as recited in claim 37 wherein the communication link is a dedicated link between the associated primary computer and the backup computer.

41. A system as recited in claim 37 wherein the communication link is a network connection between the associated primary computer and the backup computer.

42. A method as recited in claim 37 wherein the backup computer also operates as a primary computer.

* * * * *